United States Patent
Sundaram et al.

(10) Patent No.: US 7,355,832 B2
(45) Date of Patent: Apr. 8, 2008

(54) METHODS AND ARRANGEMENTS FOR REDUCING PARTIAL DISCHARGES ON PRINTED CIRCUIT BOARDS

(75) Inventors: Senthil Kumar Sundaram, Navi Mumbai (IN); Rohini Krishnamoorthy, Bangalore (IN); Cariappa Achappa Baduvamanda, Karnataka (IN)

(73) Assignee: General Electric Company, Schenectady, NY (US)

( * ) Notice: Subject to any disclaimer, the term of this patent is extended or adjusted under 35 U.S.C. 154(b) by 331 days.

(21) Appl. No.: 10/888,472

(22) Filed: Jul. 9, 2004

(65) Prior Publication Data

US 2006/0007624 A1    Jan. 12, 2006

(51) Int. Cl.
*H02H 3/22* (2006.01)
(52) U.S. Cl. ...................................... 361/111
(58) Field of Classification Search ................. 361/111, 361/112
See application file for complete search history.

(56) References Cited

U.S. PATENT DOCUMENTS

| | | | | |
|---|---|---|---|---|
| 2,982,494 | A * | 5/1961 | Amason | 244/1 A |
| 4,352,142 | A * | 9/1982 | Olson | 361/218 |
| 4,429,341 | A * | 1/1984 | King | 361/117 |
| 4,572,982 | A | 2/1986 | Farrall | |
| 4,796,153 | A * | 1/1989 | Amason et al. | 361/218 |
| 5,155,143 | A * | 10/1992 | Koleske | 522/31 |
| 5,495,130 | A * | 2/1996 | Schneider | 307/118 |
| 5,576,922 | A * | 11/1996 | Sugaya et al. | 361/120 |
| 5,631,815 | A * | 5/1997 | Cross | 363/68 |
| 6,040,055 | A * | 3/2000 | Baba et al. | 428/428 |
| 2001/0048967 | A1 | 12/2001 | Wilson et al. | |
| 2003/0030374 | A1* | 2/2003 | Pai | 313/582 |

* cited by examiner

*Primary Examiner*—Ronald W. Leja
(74) *Attorney, Agent, or Firm*—Armstrong Teasdale LLP

(57) ABSTRACT

Methods and arrangements for reducing partial discharges on a printed circuit board are provided. A method of reducing partial discharge in a printed circuit board includes providing a conducting surface coupled to a component under at least one of electrical and thermal stress, wherein the conducting surface is a metallic plate.

19 Claims, 4 Drawing Sheets

Drawing board Pins

Paper clips ends bent

Single strand copper wire

Screw

68

METHODS AND ARRANGEMENTS FOR REDUCING PARTIAL DISCHARGES ON PRINTED CIRCUIT BOARDS

BACKGROUND OF THE INVENTION

This invention relates generally to methods and arrangements for reducing partial discharges on printed circuit boards, and more particularly, to methods and arrangements for reducing partial discharges on printed circuit boards used in high voltage generators.

In high voltage generators used in medical imaging systems, such as, for example, an X-ray generator, high voltage DC is normally generated using a multiplier/doubler circuit operating at high frequency. The output voltage of the transformer is typically in tens of kilovolts (kV) and the operating frequency is in several tens of kilohertz (kHz). The rectifier units may include cascaded configurations to achieve a higher output voltage, as a higher output power is often needed for high quality X-ray generation. The operation of the rectifier units at these very high voltage levels and frequencies may result in high electrical and thermal stresses around the components on printed circuit boards (PCB).

Multiplier circuits are known to include components such as transformer coils, diodes, and capacitors mounted on a PCB forming a rectifier assembly and encased for example, within a polypropylene casing filled with oil. The oil around the multiplier PCB inside the polypropylene casing acts as a coolant and insulation.

Components and PCBs used in high and low voltage applications are likely to operate at very high stress levels. A configuration to reduce these stress zones requires adequate clearance and creepage distance between components mounted on the PCB. The amount of clearance depends on the breakdown strength of the surrounding medium such as air or oil. The creepage distance depends on the electric stress at the PCB surface and its interface with the ambient medium.

Further, and for example, in a multiplier PCB, the connections, for example, the transformer secondary coil connection to the diode through solder on the PCB (triple junction formed with solder, PCB and oil) and other diode solder points form high stress zones having electric stress. These high stress zones may cause partial discharges (PD) on the surface of the PCB that may be further enhanced at high temperature. Partial discharge and high temperature stresses together deteriorate transformer oil and PCB surface. Partial discharges may cause flashover between various components on the PCB if creepage distance is not adequate or cause puncture in the PCB if there is a significant accumulation of charges due to partial discharge on the surface of the PCB.

Thus, known methods of component mounting and connection may not provide compact assembly of components in a PCB in high power applications. Further, these may not provide reduced partial discharge conditions on the PCB.

BRIEF DESCRIPTION OF THE INVENTION

In one embodiment, a method for reducing partial discharge in a printed circuit board, is provided. The method includes providing a conducting surface coupled to a component under at least one of electrical and thermal stress in the printed circuit board, wherein the conducting surface is a metallic plate.

In yet another embodiment, a method for reducing partial discharge in a printed circuit board is provided. The method includes coupling a conductive element to a high voltage connection wherein the conductive element is a corona suppressor.

In another embodiment, a method for reducing partial discharge in a multiplier printed circuit board (PCB) is provided, the multiple PCB having components forming graded voltage levels at different locations in the PCB. The method includes providing multiple conducting surfaces coupled to at least one component under electrical and thermal stress on the PCB within an X-ray system wherein the conducting surfaces are metal plates.

DETAILED DESCRIPTION OF THE INVENTION

Various embodiments of the present invention provide a method of reducing partial discharges on printed circuit boards (PCBs) used especially in high voltage generators used in an X-ray system. However, the various embodiments are not so limited, and may be implemented in connection with other systems, such as, for example, diagnostic medical imaging systems, industrial inspection systems, security scanners, particle accelerators, etc.

Figure 1:
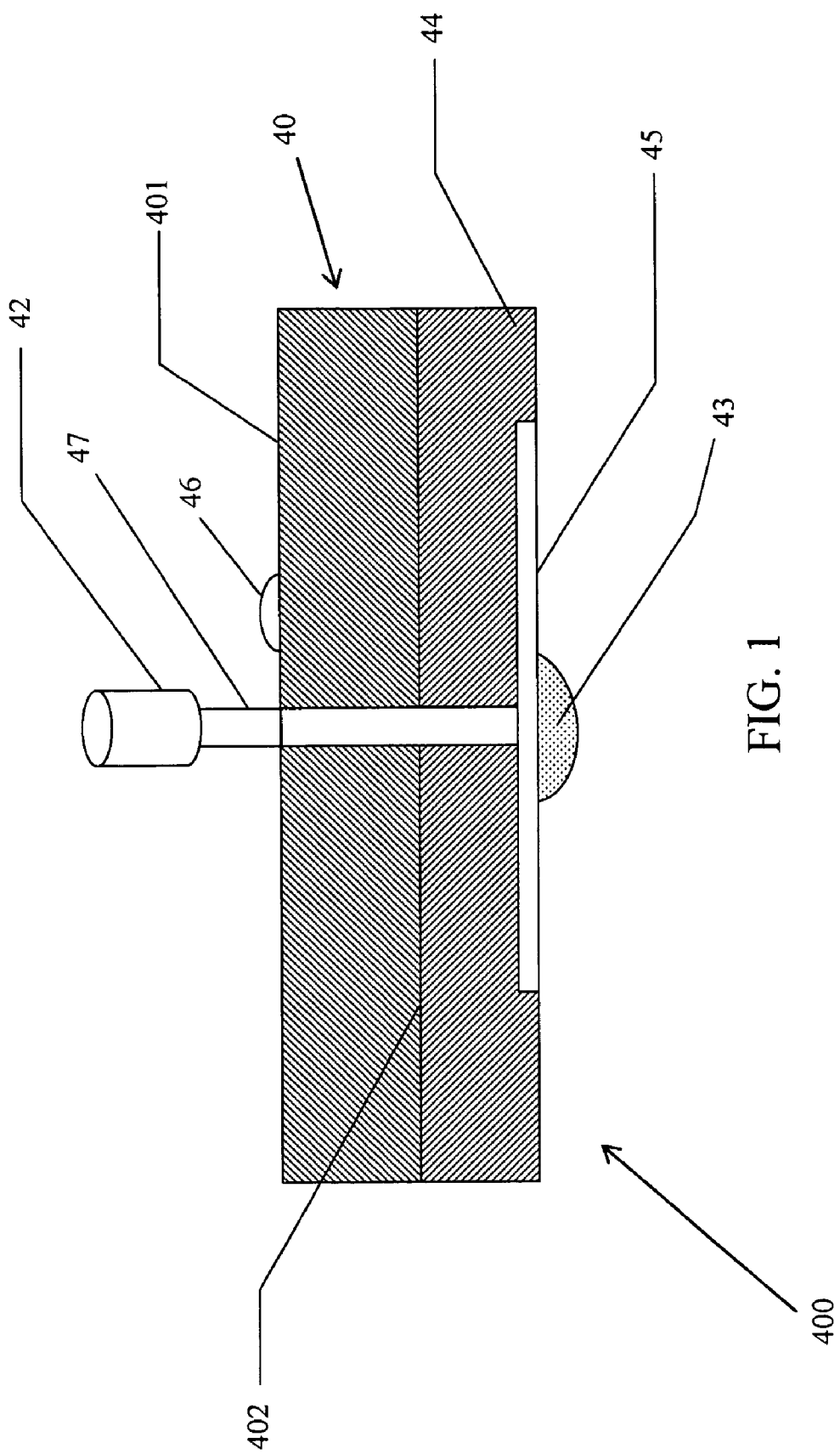
FIG. 1 is a side cross-sectional view of a PCB in an X-ray system according to an embodiment of the present invention.

FIG. 1 is a side cross-sectional view of a PCB in an X-ray system (not shown) according to one embodiment of the present invention. The PCB 400 includes a board member 40 having a first surface 401 on a first side and second surface 402 on a second side. In the embodiment shown, the first surface 401 is the component side of the PCB 400 and the second surface 402 is the solder side of the PCB 400. The board member 40 may have other components, for example, a diode 42 if configured as a rectifier, and soldered on the PCB 400. It should be noted that the rectifier PCB may include serial but zig-zag mounting of diodes (not shown) and thereby have graded voltage levels along its length.

A connection point 46 (e.g., solder joint) at the first surface 401 may be at a high voltage and susceptible to partial discharges due to high electric field concentration. The field concentration at the connection point 46 on the first surface 401 of the PCB 400 is substantially reduced by providing a conducting surface, for example, a metallic plate 45 having the same potential as the connection point 46 below the board member 40. In the embodiment shown in FIG. 1, the diode 42 also having similar voltage as the connection point 46 is electrically connected to the metallic plate 45 through leads 47 extending from the diode 42 through a dielectric 44 and connected (e.g., soldered) onto the metallic plate 45. The metallic plate 45 is insulated from the solders at the second surface 402. The dielectric 44 (e.g., epoxy) may be provided to the second surface 402 of the board member 40 to insulate the metallic plate 45 from the solder at the second surface 402. The dielectric at the second surface of the board member also reduces or eliminates field concentration at various solder points on the solder side of the PCB 400.

Figure 2:
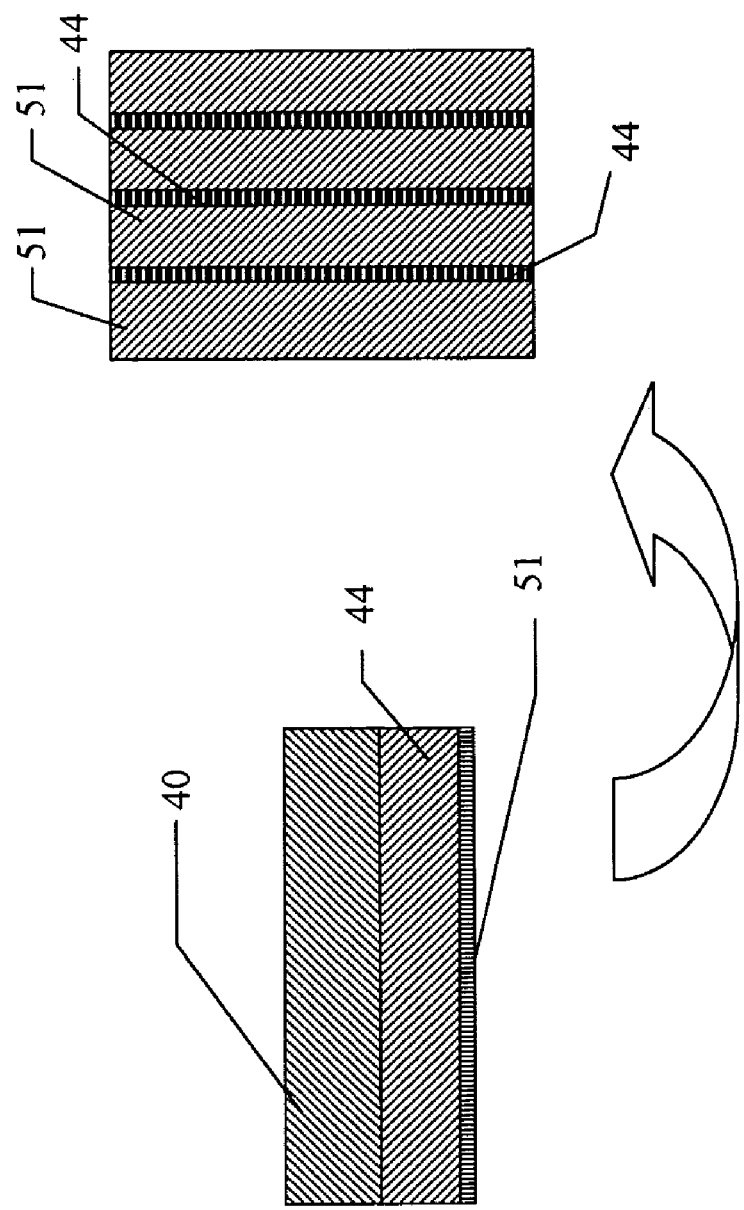
FIG. 2 is a block diagram of a metallic plate and solid dielectric arrangement according to an embodiment of the present invention.

The electric field concentration at diode lead and PCB interface on the first surface may be reduced with use of plurality of metallic plates 51 as described in FIG. 2. The metallic plates 51 may be connected with the last diode lead in a row and to a first diode 42 in the next row (not shown in the figure). These diode leads have similar potential and are at opposite sides of the PCB 400 due to serial, but zig-zag arrangement of the diodes 42. The metallic plates 51 are thereby maintained at an electric potential substantially equal to the potential of diodes 42 on the first surface 401. Note that the potential of the metal plates vary depending on the voltage gradient on the top surface of the PCB 400. The dielectric 44 is used as insulation between the plates. The thickness of the insulation between the metallic plates and solder points to reduce partial discharges on the connection point and at diode leads is less and thereby results in a compact package for high power rectifier PCB.

The heat generated at the connection point 46 and at the diode 42 are distributed by conduction to the metallic plates 51 in the PCB 400. It should be noted that in one embodiment the metallic plates 45, 51 are configured having rounded edges to minimize the field concentration at the edges.

Further, in one embodiment, the dielectric 44 may be constructed or formed of an epoxy material and the metallic plates 51 may be constructed of copper. However, other materials may be used as the dielectric 44 and/or metallic plate 51 as desired or needed. For example, the dielectric may be insulating oil or any solidified or solid insulating material.

Figure 3:
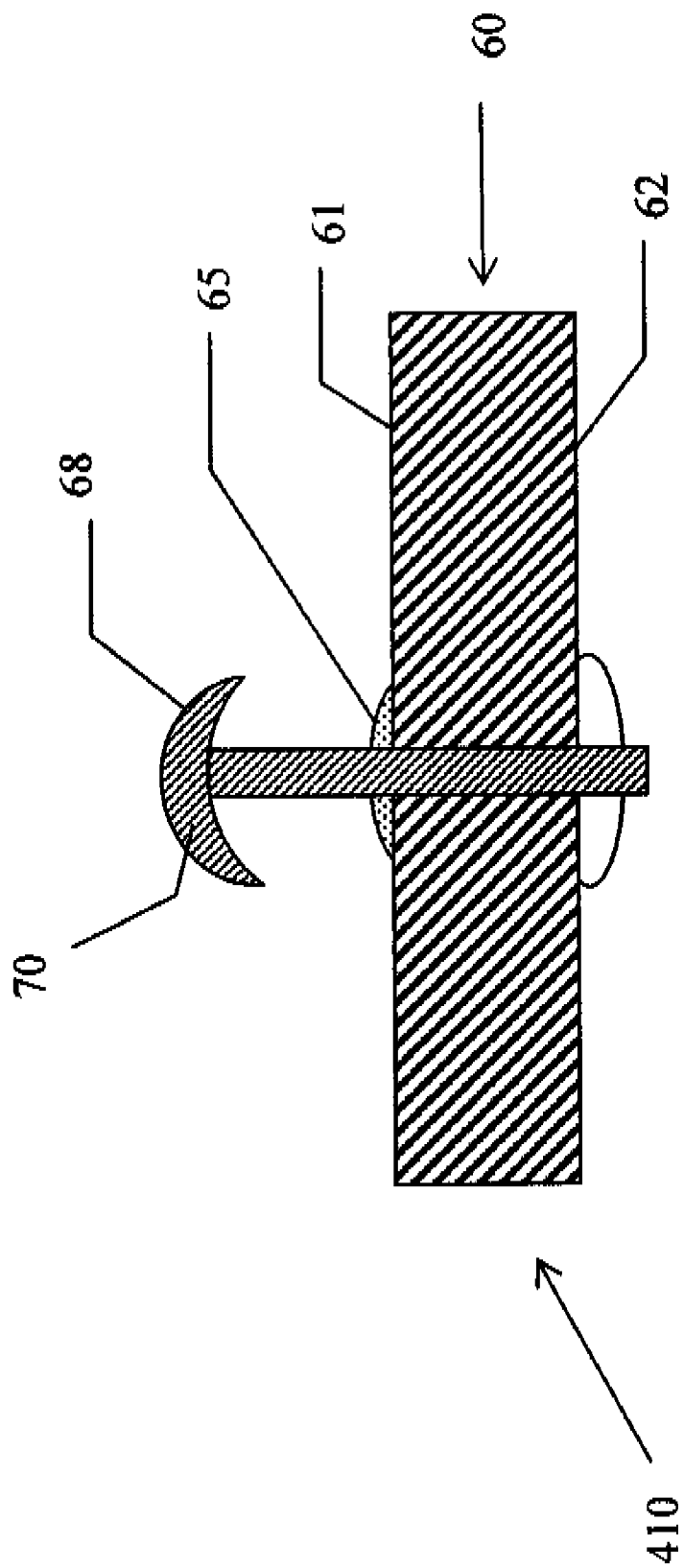
FIG. 3 is a side cross-sectional view of a PCB in an X-ray system with a corona suppressor according to an embodiment of the present invention.
Figure 4:
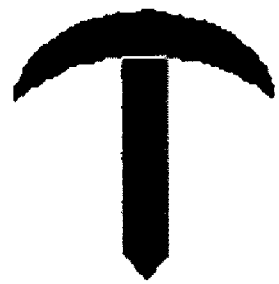
FIG. 4 is a diagram of corona suppressor elements for use with a PCB according to various embodiments of the present invention.
Figure 4:
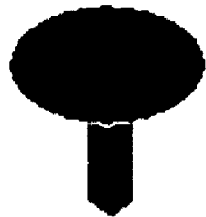
Figure 4:
Figure 4:
Figure 4:
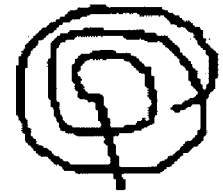
Figure 4:

FIG. 3 is a side elevation view of a PCB 410 in an X-ray system according to another embodiment of the present invention. In this embodiment, the PCB 410 includes a board member 60 having a first surface 61 on a first side and a second surface 62 on a second side. The board member 60 includes a connection point, such as, for example, a solder joint 65. A corona suppressor 68 is connected in the vicinity adjacent to or at the location of the solder joint 65. The corona suppressor 68 includes a head 70 and may be configured as, for example, drawing board pins, paper clips, paper pins with round heads, screws, spirally wound single strand wires or other designs, and a combination thereof, as shown in FIG. 4. By this connection, the corona suppressor 68 shields the solder joint 65, thereby reducing the electric field intensity at the connection point (e.g., triple junction) on the PCB 410. More specifically. the head 70 is positioned a distance from the first surface 61 and/or the second surface 62 of the board member 60 that includes the solder joint 65 such that the head 70 shields the solder joint 65. The corona suppressor 68 may be coupled from either the first surface 61 or the second surface 62 or both the surfaces 61 and 62.

It should be noted that various forms and configurations of corona suppressors may be constructed and provided as a component on the PCB 410 as desired or needed. Corona suppressors for PCB 410 may be standardized based on voltage rating and shield effectiveness.

Modifications to the embodiment shown in FIG. 3 are contemplated. For example, a corona suppressor 68 may be coupled to both the first surface 61 and second surface 62 of the board member 60. Further, and for example, a plurality of corona suppressors 68 (shown in FIG. 4) may be connected at the solder joint 65.

Thus, various embodiments of the present invention provide a PCB packaging that is constructed to have more uniform electrical stress distribution for reduced partial discharge during high power applications. Additionally, various embodiments include corona suppressors for PCBs to reduce partial discharges at connection points on the PCB.

While the invention has been described in terms of various specific embodiments, those skilled in the art will recognize that the invention can be practiced with modification within the spirit and scope of the claims.

What is claimed is:

1. A method of reducing partial discharge in a printed circuit board comprising:
    providing a conducting surface coupled to a first side of the printed circuit board under at least one of electrical and thermal stress, wherein the conducting surface is a metallic plate;
    providing a solid dielectric between the metallic plate and the first side of the printed circuit board; and
    extending a lead between the metallic plate and a diode positioned on a second side of the printed circuit board, wherein the lead extends through the dielectric.

2. A method according to claim 1 wherein the printed circuit board comprises a solder side and a component side and wherein the conducting surface is provided at the solder side of the printed circuit board.

3. A method according to claim 1 wherein the conducting surface comprises a plurality of metallic plates.

4. A method according to claim 3 further comprising configuring the metallic plates having rounded edges.

5. A method according to claim 3 further comprising configuring the metallic plates to have a width defined to provide a uniform electric field intensity along adjacent locations exposed to at least one of a high temperature and electric field.

6. A method according to claim 1 wherein the solid dielectric comprises an epoxy material.

7. A method according to claim 1 further comprising encapsulating the printed circuit board in the solid dielectric.

8. A method for reducing partial discharge in a printed circuit board, said method comprising:
    coupling at least one conductive element to a high voltage connection on a first side of a printed circuit board, wherein the at least one conductive element is a corona suppressor that extends from the first side of the printed circuit board to a second side of the printed circuit board, wherein a head of the corona suppressor is positioned adjacent the first surface to shield the high voltage e connection.

9. A method according to claim 8 wherein the conductive element is at least one of drawing board pins, paper clips, paper pins with round head, screws, spirally wound single strand wires and a combination thereof.

10. A method according to claim 9 wherein the high voltage connection comprises a solder joint.

11. An arrangement for reducing partial discharge in a printed circuit board, said arrangement comprising:
    at least one conductive element coupled to a location under electrical stress on a first side of a printed circuit board, wherein the at least one conductive element is a corona suppressor that extends from the first side of the printed circuit board to a second side of the printed circuit board, wherein a head of the corona suppressor is positioned adjacent the first surface to shield the location under electrical stress.

12. An arrangement according to claim 11 wherein the conductive element is at least one of drawing board pins, paper clips, paper pins with round head, screws, spirally wound single strand wires and a combination thereof.

13. An arrangement according to claim 11 wherein the corona suppressor is coupled to at least one connection member on a solder side of the printed circuit board.

14. An arrangement according to claim 11 wherein the corona suppressor is coupled to at least one solder point on a solder side of the printed circuit board.

15. An arrangement according to claim 11 wherein the corona suppressor is coupled to each of a solder and a non-solder side of the printed circuit board.

16. An arrangement according to claim 11 wherein said at least one conductive element is configured based on an operating voltage of the printed circuit board.

17. An arrangement according to claim 11 wherein said at least one conductive element is configured as a miniature component having a predetermined voltage rating.

18. An arrangement according to claim 11 wherein said at least one conductive element is configured as a miniature component having a predetermined shield effectiveness.

19. A method for reducing partial discharge in a multiplier printed circuit board (PCB), the multiplier PCB having a plurality of components forming graded voltage levels at different locations in the PCB, said method comprising:

providing multiple conducting surfaces, a first conducting surface of the multiple conducting surfaces coupled to a first side of a first component of the plurality of components under electrical and thermal stress on the PCB within an X-ray system, wherein the conducting surfaces are metal plates;

providing a solid dielectric between the metal plates; and extending a lead between at least one metallic plate and a diode positioned on a second side of the first component, wherein the lead extends through the dielectric.

* * * * *